United States Patent
Eberler et al.

(10) Patent No.: US 10,557,900 B2
(45) Date of Patent: Feb. 11, 2020

(54) BODY COIL HAVING A PRE-AMPLIFICATION UNIT CONFIGURED TO PROVIDE A DETUNING EFFECT

(71) Applicants: Ludwig Eberler, Neumarkt i.d. OPf. (DE); Volker Matschl, Bamberg (DE); Jürgen Nistler, Erlangen (DE)

(72) Inventors: Ludwig Eberler, Neumarkt i.d. OPf. (DE); Volker Matschl, Bamberg (DE); Jürgen Nistler, Erlangen (DE)

(73) Assignee: Siemens Healthcare GmbH, Erlangen (DE)

(*) Notice: Subject to any disclaimer, the term of this patent is extended or adjusted under 35 U.S.C. 154(b) by 309 days.

(21) Appl. No.: 15/200,522

(22) Filed: Jul. 1, 2016

(65) Prior Publication Data

US 2017/0016969 A1    Jan. 19, 2017

(30) Foreign Application Priority Data

Jul. 16, 2015  (DE) .................. 10 2015 213 388
Mar. 21, 2016  (DE) .................. 10 2016 204 620

(51) Int. Cl.
  *G01R 33/36*  (2006.01)
  *G01R 33/34*  (2006.01)
(52) U.S. Cl.
  CPC ...... *G01R 33/365* (2013.01); *G01R 33/34046* (2013.01); *G01R 33/3614* (2013.01)
(58) Field of Classification Search
  CPC ............. G01R 33/365; G01R 33/3453; G01R 33/34069; G01R 33/34076; G01R 33/34046; G01R 33/3614

USPC ................................................. 324/309, 318
See application file for complete search history.

(56) References Cited

U.S. PATENT DOCUMENTS

| 6,351,124 B1 | 2/2002 | Vester et al. | |
| 7,791,344 B2 * | 9/2010 | Nistler | G01R 33/3607 324/318 |
| 2008/0061783 A1 * | 3/2008 | Schwilch | G01R 33/3621 324/318 |
| 2011/0043209 A1 | 2/2011 | Zhu | |
| 2011/0291655 A1 | 12/2011 | Hamamura et al. | |
| 2012/0319687 A1 | 12/2012 | Chu et al. | |

(Continued)

FOREIGN PATENT DOCUMENTS

| CN | 104204836 | 12/2014 |
| DE | 102006037196 B3 | 6/2008 |

(Continued)

OTHER PUBLICATIONS

Korean Patent Application No. 10-2016-0090001, dated Nov. 20, 2017, with English Translation.

(Continued)

*Primary Examiner* — Farhana A Hoque
(74) *Attorney, Agent, or Firm* — Lempia Summerfield Katz LLC

(57) ABSTRACT

The embodiments relate to a body coil, to a magnetic resonance device, and to a method for operating a magnetic resonance device. The body coil includes at least one antenna unit and at least one pre-amplification unit, wherein the pre-amplification unit is arranged at a feed point of the antenna unit, wherein the pre-amplification unit has an input reflection factor at the feed point of the antenna unit whose value is greater than 0.7.

20 Claims, 5 Drawing Sheets

(56) References Cited

U.S. PATENT DOCUMENTS

| | | | |
|---|---|---|---|
| 2013/0271143 A1* | 10/2013 | Vester | G01R 33/365 324/322 |
| 2013/0342199 A1* | 12/2013 | Bollenbeck | G01R 33/3692 324/307 |
| 2015/0015259 A1 | 1/2015 | Duan et al. | |
| 2015/0035534 A1* | 2/2015 | Matschl | G01R 33/34015 324/318 |

FOREIGN PATENT DOCUMENTS

| | | |
|---|---|---|
| JP | 2011025118 A | 12/2011 |
| JP | 2013000591 A | 1/2013 |
| KR | 20140001763 A | 1/2014 |
| WO | 2011022806 | 3/2011 |

OTHER PUBLICATIONS

German office Action for related German Application No. 10 2015 213 388.5 dated Mar. 22, 2016, with English Translation.
Office Action cited in the corresponding Chinese patent application No. 201610552698.7 with English translation; dated Oct. 29, 2018; 14 pages.

* cited by examiner

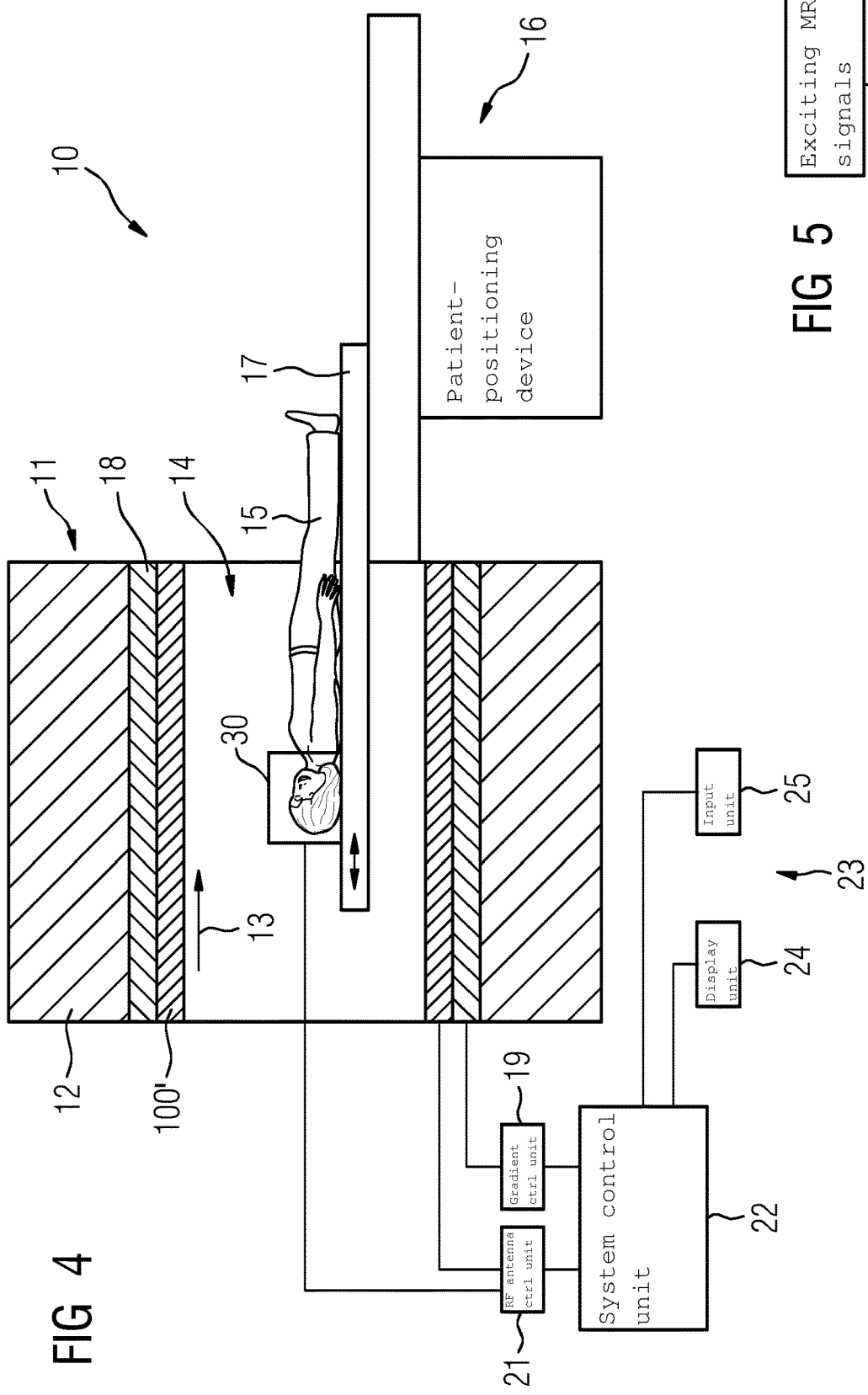

BODY COIL HAVING A PRE-AMPLIFICATION UNIT CONFIGURED TO PROVIDE A DETUNING EFFECT

This application claims the benefit of DE 10 2015 213 338.5, filed on Jul. 16, 2015, and DE 10 2016 204 620.9, filed on Mar. 21, 2016, which are hereby incorporated by reference in their entireties.

TECHNICAL FIELD

The embodiments relate to a body coil, to a magnetic resonance device, and to a method for operating a magnetic resonance device.

BACKGROUND

In the case of the imaging examination of objects, (e.g., patients), by Magnet Resonance Imaging (MRI), a (e.g., permanently installed) body coil, which may also be called a whole body resonator, is currently used for exciting magnetic resonance signals, and this has an antenna unit for this purpose. The magnetic resonance signals may have frequencies around a Larmor frequency. While it is possible to also use the body coil for receiving the magnetic resonance signals, dedicated local coils may be used for this purpose, however. These are conventionally positioned close to the patient and consequently supply a high Signal-to-Noise Ratio (SNR). Furthermore, modern local coils conventionally include a large number of individual coil elements. Magnetic resonance signals of a coil element received during a receiving interval may be amplified by a receive amplifier. The high number of coil elements means imaging techniques, in particular parallel imaging techniques, such as, for example, Sensitivity Encoding (SENSE) or Generalized Autocalibrating Partially Parallel Acquisition (GRAPPA) may be applied, which in part lead to significantly reduced scanning times with the same image quality.

To achieve a high image quality, it is desirable to reduce coupling of the body coil to the one or more local coil(s) as much as possible. Coupling may cause detuning of the local coils, so an adjustment of the coil element to the receive amplifier is affected. Furthermore, noise from the body coil may also be coupled into the local coil. Both effects lead to a significant deterioration in a resulting image quality that may manifest itself in a worse signal-to-noise ratio and/or in altered spatial receiving characteristics of the local coil. For this reason, as a rule, either only the local coils or only the body coil are/is used nowadays for receiving magnetic resonance signals.

What are known as detune circuits are used in conventional body coils to suppress coupling of the body coil with local coils during the receiving interval. These have, for example, PIN diodes and deactivate the body coil during the receiving interval. The function of the detune circuit conventionally consists in disconnecting current paths in the antenna unit of the body coil and/or shifting an operating frequency of the antenna unit that conventionally corresponds to the Larmor frequency so optimally low coupling to the local coils occurs.

SUMMARY AND DESCRIPTION

The scope of the present invention is defined solely by the appended claims and is not affected to any degree by the statements within this summary. The present embodiments may obviate one or more of the drawbacks or limitations in the related art.

Disclosed herein is a body coil that may be detuned more easily and effectively.

The body coil therefore includes at least one antenna unit and at least one pre-amplification unit arranged at a feed point of the antenna unit. The pre-amplification unit has an input reflection factor at the feed point of the antenna unit whose value is greater than 0.7, greater than 0.8, or greater than 0.9.

The at least one antenna unit is conventionally a technical arrangement, in particular a conductor structure, for radiating electromagnetic waves, (e.g., for exciting magnetic resonance signals), and/or for receiving electromagnetic waves, (e.g., magnetic resonance signals). Any received magnetic resonance signals may be forwarded to the at least one pre-amplification unit and amplified by it. The feed point may be regarded as the input of the antenna unit and/or as the electrical connection point at which the at least one pre-amplification unit is connected to the at least one antenna unit.

The input reflection factor, which may also be called the scattering parameter, S-parameter for short, $S_{11}$, is used for describing the behavior of the at least one pre-amplification unit at the feed point of the at least one antenna unit. Its value may be at most 1. The value of the input reflection factor of the at least one pre-amplification unit is advantageously as high as possible, e.g., as close to 1 as possible. This may be achieved by high impedance as well as low impedance. A resonance of the antenna unit may consequently be damped and/or the coupling of the body coil to possible local coils be minimized.

Possible detune circuits, as are conventionally used, may therefore be omitted, e.g., the antenna unit may be free from detune circuits. Instead, a detuning effect of the pre-amplification unit is used.

Dispensing with possible detune circuits leads to a noticeable simplification. Possible material costs for detune circuits and labor costs for their integration do not apply therefore for the manufacture of the body coil. Furthermore, the reliability of the body coil is increased since PIN diodes, which are consequently no longer necessary but which are used as switching elements in conventional body coils, have a relatively high risk of failure. Furthermore, dispensing with the detune circuits in the body coil facilitates tuning of the antenna unit since otherwise necessary signal routings to the detune circuits disrupt the symmetry of the antenna unit. In particular, influencing of a field distribution of an antenna unit may be avoided thereby. Finally, possible losses in the detune circuits may be avoided. For example, the efficiency of the antenna may be increased since a higher field strength may be achieved with the same amount of transmission power.

One embodiment of the body coil provides that the body coil includes a birdcage coil, often also called a birdcage antenna, and/or TEM antenna and/or saddle coil.

Birdcage coils conventionally include two end rings connected to each other by a plurality of, in particular parallel, rods. The feed point may be located at one of the end rings. Additionally, or alternatively, the feed point may be located, for example, centrally on one of the plurality of rods. Birdcage coils have high signal homogeneity, and it is for this reason that the birdcage coils are particularly suitable.

A TEM antenna is configured to transmit and/or receive transverse electromagnetic (TEM) waves and may include a plurality of, (e.g., parallel), active conductors. TEM antennae may not have an end ring.

Saddle coils are particularly suitable with low field strengths.

The pre-amplification unit may include a pre-amplifier having an input reflection factor whose value is greater than 0.7, greater than 0.8, or greater than 0.9. In other words, the body coil may be particularly effective detuned, (e.g., a pre-amplifier of this kind), which may also be called a receive amplifier, may be used to minimize coupling of the body coil to possible local coils. Detune circuits in the body coil may be omitted as a result.

The pre-amplification unit may include a switch for connecting the pre-amplifier to the feed point of the antenna unit. By actuating the switch, it is possible to change between a plurality of operating states, such as, for example, a first operating state for receiving radio-frequency (RF) signals, (e.g., magnetic resonance signals), and a second operating state for transmitting RF signals. In the first operating state, the pre-amplifier may be connected to the feed point of the antenna unit. In the second operating state, a possible transmitting unit, which may include, for example, a power splitter and/or an RF power amplifier and/or an RF generator for RF pulses, may be connected to the feed point of the antenna unit.

The body coil may consequently be used for transmitting as well as for receiving, wherein the body coil is detuned by the pre-amplification unit when receiving.

One embodiment of the body coil provides that the pre-amplification unit includes high-power impedance.

In particular, it is conceivable to use a protective circuit, including, for example, anti-parallel diodes, or a send-receive switch as the high-power impedance. This enables a transmitting mode of possible local coils.

Conventional pre-amplifiers may potentially not be power-fixed enough to remain undamaged during a transmitting mode of possible local coils, e.g., overcoupled power from the local coil to a body coil in receiving mode may damage the pre-amplifier of the body coil. A remedy may be created, for example, in that high-power impedance is connected to the feed point of the antenna unit of the body coil during a transmitting period of the local coil.

To connect the high-power impedance to the feed point of the antenna unit the pre-amplification unit advantageously has a switch. This switch may be incorporated, for example, by a three-way switch that, in addition to the connection of the feed point of the antenna unit to the high-power impedance, also enables a connection to a pre-amplifier and a transmitting unit.

The powerful impedance may have an input reflection factor whose value is greater than 0.7, greater than 0.8, or greater than 0.9. The body coil may be particularly effectively detuned as a result, e.g., a high-power impedance of this kind may be used to minimize coupling of the body coil to possible local coils. In particular, the impedance of the powerful impedance thereby equals the impedance of a possible pre-amplifier, which may also be incorporated by the pre-amplification unit, so the powerful impedance, like the pre-amplifier, has a suitable input reflection factor in the feed point of the antenna unit.

The input reflection factor of the pre-amplification unit may have a phase in a range of 165° to 195°, 170° to 190°, or 175° to 185° at the feed point of the antenna. In one example, this phase is 180°.

The input reflection factor of the pre-amplification unit, (e.g., of a possible pre-amplifier and/or possible powerful impedance), is consequently transformed at the feed point of the antenna unit such that its resonance is consequently damped as much as possible and/or the detuning effect of the pre-amplification unit is maximized. As a rule, a short circuit at the feed point of the antenna unit is advantageous for this purpose.

One embodiment provides that the pre-amplification unit has at least has one transformation element, in particular a phase shifter, for adjusting the phase of the input reflection factor. The phase may be adjusted particularly easily thereby.

It is also conceivable for the pre-amplification unit to have at least one cable length adjusted to the phase for adjusting the phase of the input reflection factor. This may be achieved, in particular, if the desired phase of the input reflection factor at the feed point, which may be 180°, is the same as a phase $\varphi_{vv}$ of the input reflection factor, measured directly at a possible pre-amplifier, minus a doubled phase length $\varphi_L$ of the cable (in transmission): $180°=\varphi_{vv}-2\varphi_L$.

A mechanical length L results from the phase length $\varphi_L$ when the Larmor frequency and a cable-specific reduction factor are taken into account.

By adjusting the cable length, it is possible to influence the phase without additional components.

A further embodiment provides that the pre-amplification unit includes a first switch configured to switch the feed point of the antenna unit between a transmitting path and a receiving path. The pre-amplification unit may include a terminating impedance, a pre-amplifier, and a second switch in the receiving path. The second switch is configured to switch between the terminating impedance and the pre-amplifier.

The terminating impedance does not need to be configured to be powerful. The terminating impedance may have an input reflection factor of −1. This may be achieved by designing the terminating impedance as a short circuit. To implement a short circuit, the inner conductor may be directly connected to the outer conductor in the case of a coaxial system, for example.

The body coil is conventionally configured to emit excitation signals having an excitation signal wavelength. For example, the excitation frequency in the case of a magnetic resonance device having a main magnetic field of 1.5 T is about 64 MHz, and this corresponds to an excitation signal wavelength of about 4.7 m in air and about 3.3 m in a cable. Between the feed point of the antenna unit and the terminating impedance, the pre-amplification unit may have a cable length that is an integral multiple of half the wavelength of the excitation signal wavelength. The cable length in the above-cited example may be about 1.63 m, 3.3 m, or 4.95 m, etc.

With a terminating impedance having an input reflection factor of −1, the pre-amplification unit at the feed point of the antenna unit may, for example, easily have an input reflection factor whose value is greater than 0.7.

The first switch advantageously has a higher power than the second switch. The first switch may have a high power to be able to reliably switch the given powers on the transmitting path. The powers transmitted on the receiving path may be lower, so the second switch located there may also be configured so as to be less power-fixed without incurring damage.

In particular, if it is provided that the excitation of magnetic resonance signals, (e.g., transmitting excitation signals), occurs solely through the body coil, and not, for instance, through possible local coils, the pre-amplification unit may therefore have a simpler design.

A magnetic resonance device is also proposed, including a body coil as disclosed herein. The advantages of the magnetic resonance device match the advantages of the body coil described above in detail.

The omission of otherwise conventional detune circuits, enabled by the proposed body coil, means the magnetic resonance device may be simplified since infrastructure, such as, for example, voltage and current generation for the detune circuits, control logic, cabling, etc., may be omitted.

The magnetic resonance device may include at least one local coil. This at least one local coil may receive magnetic resonance signals at the same time as the body coil since the local coil and the body coil are decoupled by the described circuit.

Furthermore, a method for operating a magnetic resonance device having a body coil and at least one local coil. The method includes an excitation of magnetic resonance signals, and receiving at least some of the magnetic resonance signals.

The advantages of the method for operating a magnetic resonance device match the advantages of the body coil and/or the magnetic resonance device, which have been stated above in detail. Features, advantages, or alternative embodiments mentioned in this connection may also be transferred to the other disclosed subject matters and vice versa.

Excitation may occur using RF signals generated by the magnetic resonance device, in particular by the body coil and/or by the at least one local coil. The RF signals may be absorbed by nuclei of an examination object. As a consequence, the nuclei may emit magnetic resonance signals that may be simultaneously received at least partly by just the body coil or by just the at least one local coil or by both types of coil.

The body coil may include an antenna unit and high-power impedance, wherein in the case of excitation of the magnetic resonance signals by the at least one local coil, the antenna of the body coil is connected to the high-power impedance, (e.g., the high-power impedance is activated during a transmitting interval), so no damage may occur to a possible pre-amplifier due to power transfer from the transmitting local coil to the body coil.

It is also proposed that the magnetic resonance signals are simultaneously received by the at least one local coil and the body coil.

An improvement in image homogeneity may be achieved when signals are simultaneously received by the at least one local coil and the body coil. This may be explained by the fact that body coils conventionally have a spatial receiving profile of higher homogeneity compared to local coils. The magnetic resonance signals received by the body coil may therefore contribute to an improvement in image quality in slices of the examination object remote from the surface.

Furthermore, some imaging methods, which require magnetic resonance signals from local coils as well as from the body coil, may be accelerated due to signals being received simultaneously. These include, for example, normalization methods in which the signals are currently sequentially scanned by local coils and body coils.

Furthermore, investigations have shown that in the case of heavy duty cases, for example, examination of people in the abdominal region, the signal-to-noise ratio of the resulting image may be increased by the at least one local coil and the body coil receiving signals simultaneously.

Alternatively, the magnetic resonance signals are excited solely by the body coil. The antenna unit of the body coil is connected to the terminating impedance when the magnetic resonance signals are received by the at least one local coil. This variant enables a simpler construction of the pre-amplification unit since possible high-power impedance and a possible high-power three-way switch may be omitted.

BRIEF DESCRIPTION OF THE DRAWINGS

Further advantages, features, and details emerge from the exemplary embodiments described below and with reference to the drawings. Mutually corresponding parts are provided with the same reference numerals in all figures.

FIG. 4 depicts a schematic diagram of a magnetic resonance device according to one example.

FIG. 5 depicts a block diagram of a method according to one example.

DETAILED DESCRIPTION

Figure 1:
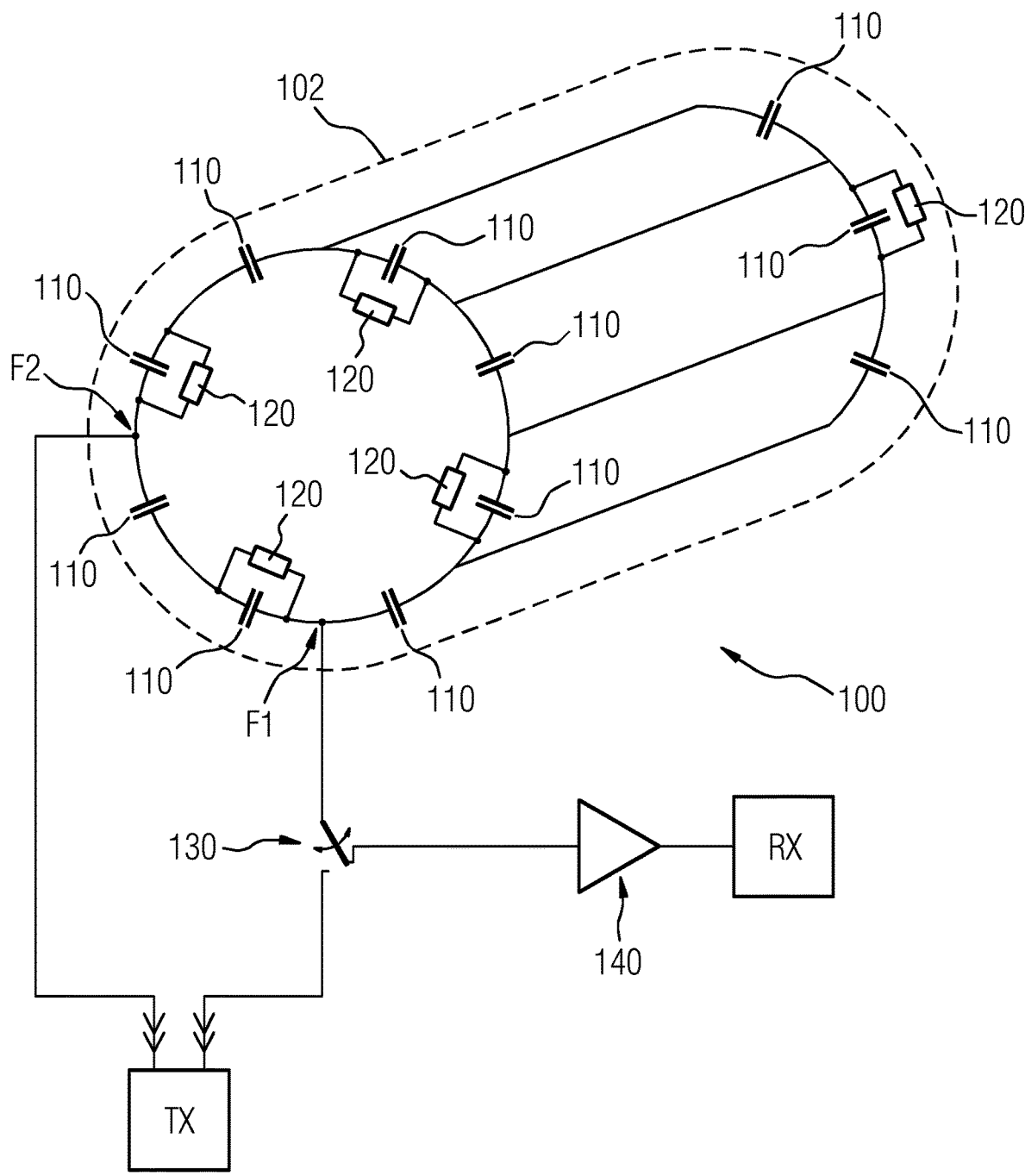
FIG. 1 depicts a schematic diagram of a conventional body coil.

FIG. 4 schematically depicts a magnetic resonance device 10. The magnetic resonance device 10 includes a magnetic unit 11 having a superconductive main magnet 12 for generating a strong and, in particular, homogeneous magnetic field 13 in the scanning region. The magnetic resonance device 10 also includes a patient-receiving region 14 for receiving a patient 15. In the present exemplary embodiment, the patient-receiving region 14 is cylindrical and cylindrically surrounded by the magnetic unit 11 in a circumferential direction. A different design of the patient-receiving region 14 is also conceivable. The patient 15 may be pushed by a patient-positioning device 16 of the magnetic resonance device 10 into the patient-receiving region 14. The patient-positioning device 16 has for this purpose a patient couch 17 arranged so as to move inside the patient-receiving region 14.

The magnetic unit 11 also has a gradient coil unit 18 for generating magnetic field gradients used for spatial encoding during imaging. The gradient coil unit 18 is controlled by a gradient control unit 19 of the magnetic resonance device 10. The magnetic unit 11 also includes a radio-frequency antenna unit, which in the present exemplary embodiment is configured as a body coil 100' permanently integrated in the magnetic resonance device 10. The body coil 100' is configured for an excitation of nuclei, which is established in the main magnetic field 13 generated by the main magnet 12. The body coil 100' is controlled by a radio-frequency antenna control unit 21 of the magnetic resonance device 10 and irradiates radio-frequency magnetic resonance sequences into an examination space formed by a patient-receiving region 14 of the magnetic resonance device 10. The body coil 100' is also configured to receive magnetic resonance signals.

The magnetic resonance signals may be received, in particular, by a local coil 30 connected here to the radio-frequency antenna control unit 21. In this example, the local coil 30 is arranged in the head region of the patient 15. It is of course also possible for a plurality of local coils to be used instead of one.

For controlling the main magnet 12 of the gradient control unit 19 and for controlling the radio-frequency antenna control unit 21, the magnetic resonance device 10 has a system control unit 22. The system control unit 22 centrally controls the magnetic resonance device 10, such as, for example, carrying out a predetermined imaging gradient echo sequence. Furthermore, the system control unit 22 includes an evaluation unit for evaluation of medical image data acquired during the magnetic resonance examination. The magnetic resonance device 10 also includes a user interface 23 connected to the system control unit 22. Control information, such as, for example, imaging parameters, and reconstructed magnetic resonance images, may be displayed on a display unit 24, (e.g., on at least one monitor), of the user interface 23 for a medical operator. The user interface 23 also has an input unit 25 by which information and/or parameters may be input by the medical operator during a scanning process.

The illustrated magnetic resonance device 10 in the present exemplary embodiment may include further components that magnetic resonance devices conventionally have. A general mode of operation of a magnetic resonance device 10 is known to a person skilled in the art, moreover, so a detailed description of the general components may be omitted.

FIG. 1 depicts a conventional body coil 100 configured as a birdcage coil. An antenna unit 102 includes two end rings connected by the plurality of rods. At the end, rings are located capacitors 110 and detune circuits 120, and these may include PIN diodes. The detune circuits are used for deactivating the body coil during a period in which possible local coils 30 receive magnetic resonance signals. A depiction of the controller and voltage supply of the detune circuits 120 has been omitted.

The antenna unit 102 is connected to a transmitter unit TX by a feed point F2. The transmitter unit TX may include, for example, a power splitter and/or an RF power amplifier and/or an RF generator for RF pulses. Depending on the switching state of a switch 130 a feed point F1 is connected to the transmitter unit TX or a receiver unit RX. A pre-amplifier 140 is arranged in the path between feed point F1 and receive unit RX, wherein the pre-amplifier is configured to amplify magnetic resonance signals received by the body coil 100 and to forward them to the radio-frequency antenna control unit 21. Conventional pre-amplifiers 140 in conventional body coils may have input impedances of 50Ω, and this corresponds to an input reflection factor $S_{11}$ of zero.

Figure 2:
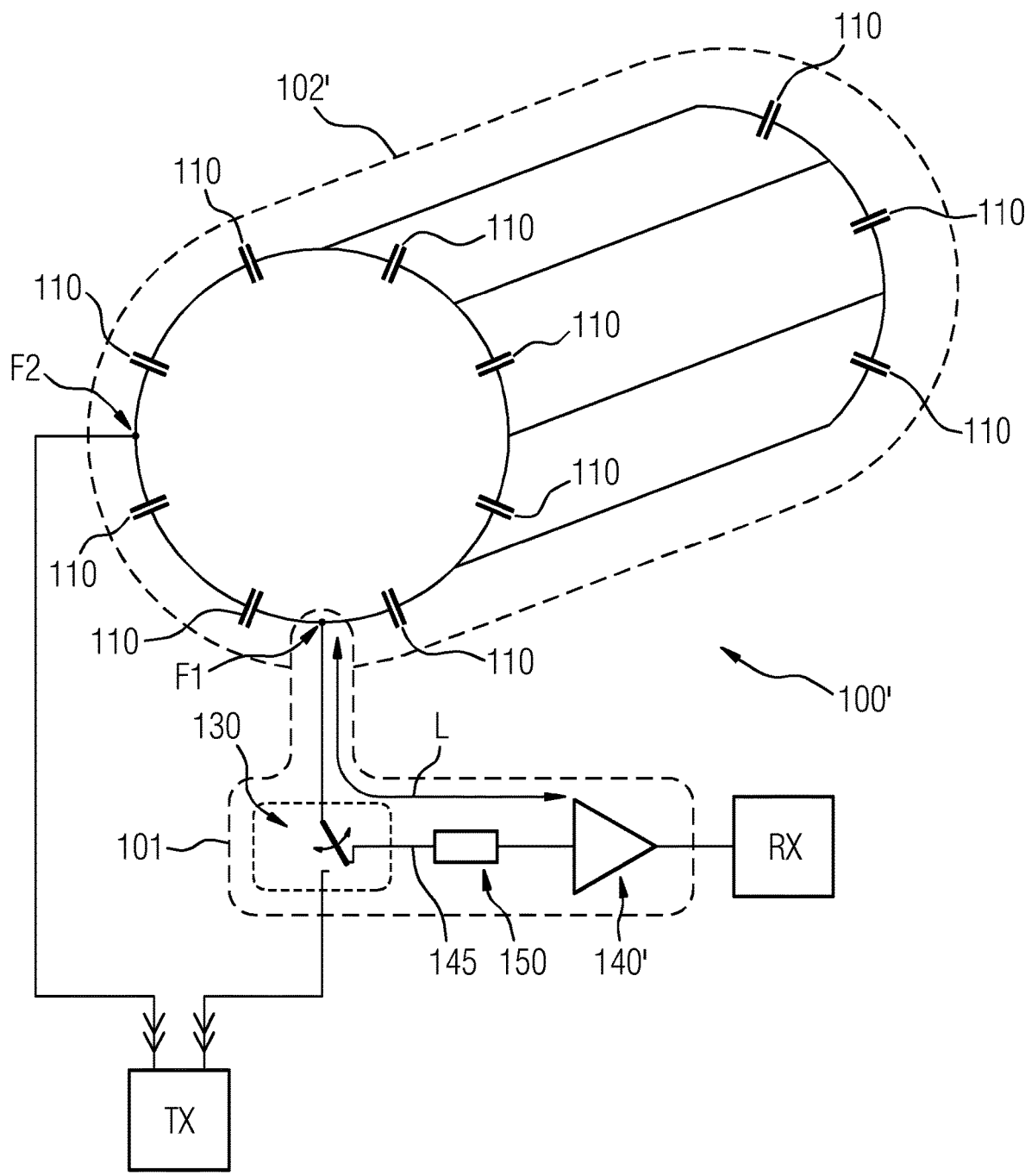
FIG. 2 depicts a schematic diagram of a body coil according to one example.

FIG. 2 depicts, by way of example, a body coil 100'. In contrast to conventional body coils depicted in FIG. 1, the body coil 100' is free from detune circuits 120. By contrast, the body coil 100' has a pre-amplification unit 101 arranged at the feed point F1 and at the feed point F1 of the antenna unit 102' advantageously has an input reflection factor whose value is as large as possible, in particular greater than 0.7, greater than 0.8, or greater than 0.9. The resonance of the antenna unit 102' may be particularly well damped thereby, so in the case of a high attainable signal-to-noise ratio it is possible for the body coil 100' and the local coil 30 to receive magnetic resonance signals simultaneously.

The pre-amplification unit 101 has a pre-amplifier 140' that may be connected by a cable 145 to the feed point F1. In particular, the pre-amplifier 140' is configured such that the value of its input reflection factor is as large as possible, in particular is greater than 0.7, greater than 0.8, or greater than 0.9. The input reflection factor of the pre-amplification unit 101, in particular of the pre-amplifier 140', is transformed by a suitable cable length L of cable 145 and an additional transformation element 150 at the feed point F1 of the antenna unit such that the input reflection factor of the pre-amplification unit 101 at the feed point of the antenna is adjusted to a phase in a range of 165° to 195°, 170° to 190°, or 175° to 185°. The additional transformation element 150 may be, for example, a phase shifter. It is also conceivable, however, for the phase to also be transformed to the desired value, which may be 180°, with the cable 145 alone, e.g., without additional transformation element 150.

Figure 3:
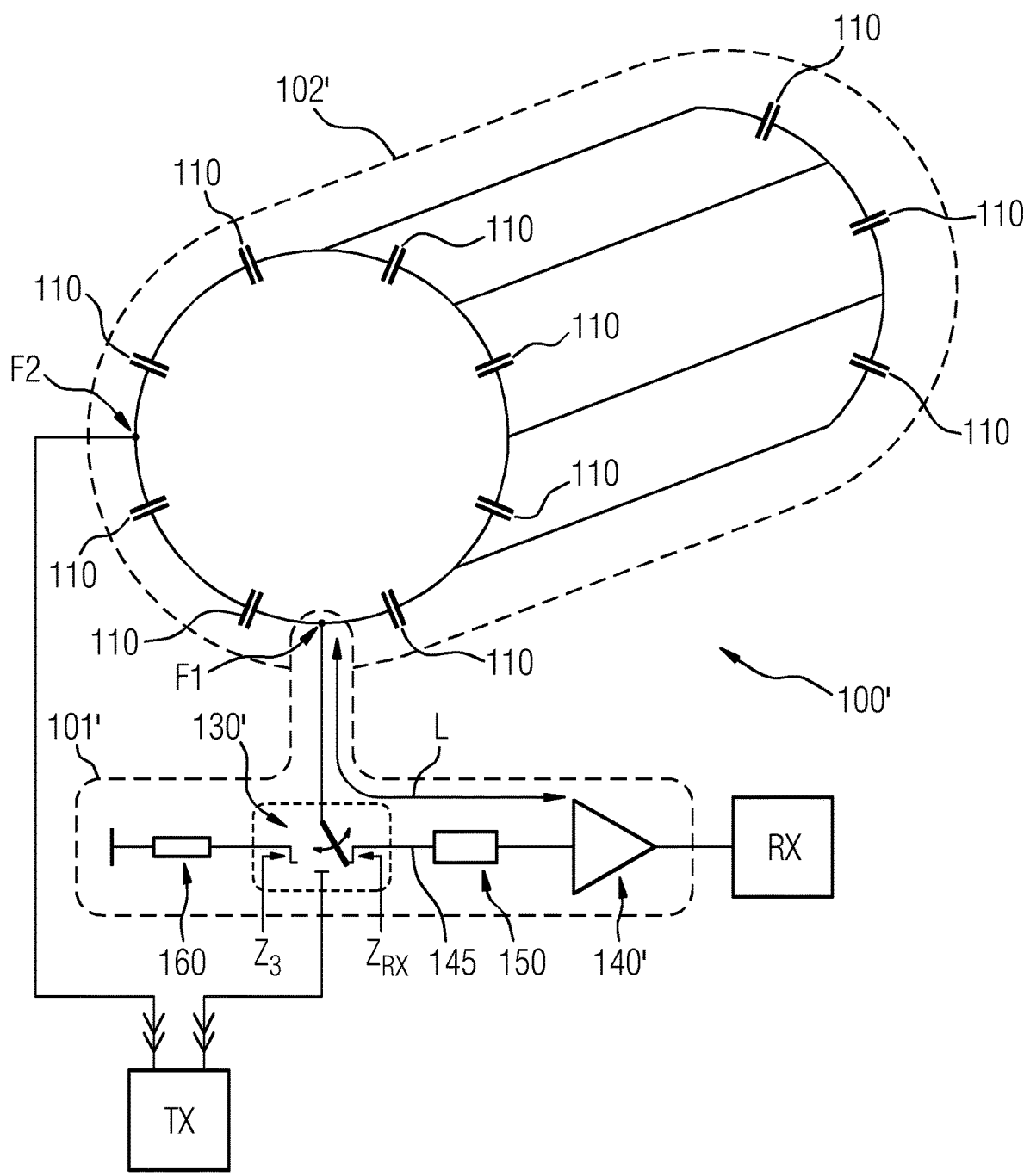
FIG. 3 depicts a schematic diagram of an expanded body coil according to one example.

The switch 130 may switch between two operating states here, namely a receiving mode, in which the feed point F1 is connected to the receive unit RX, and a transmitting mode, in which the feed point F1 is connected to the transmitter unit TX. This switch 130 is expanded in FIG. 3 to a three way switch 130'. In a third operating state, in which the local coil 30 transmits RF signals, this connects the feed point F1 to high-power impedance 160 in order to prevent the pre-amplifier 150 from incurring damage. The pre-amplification unit 101' includes two paths here therefore, between which the switch 130' may switch: a first path to the pre-amplifier 140' and a second to powerful impedance 160. Both paths are designed, however, such that the value of the input reflection factor is as large as possible. The powerful impedance 160 therefore also has an input reflection factor whose value is greater than 0.7, greater than 0.8, or greater than 0.9. In particular, the impedances of the paths $Z_3$ and $Z_{RX}$ are the same, e.g., the same input reflection factors act on feed point F1.

Furthermore, the phase is also adjusted on the path to the powerful impedance 160 in a range of 165° to 195°, 170° to 190°, or 175° to 185°. In some examples, a transformation element may also be used on this path.

Figure 6:
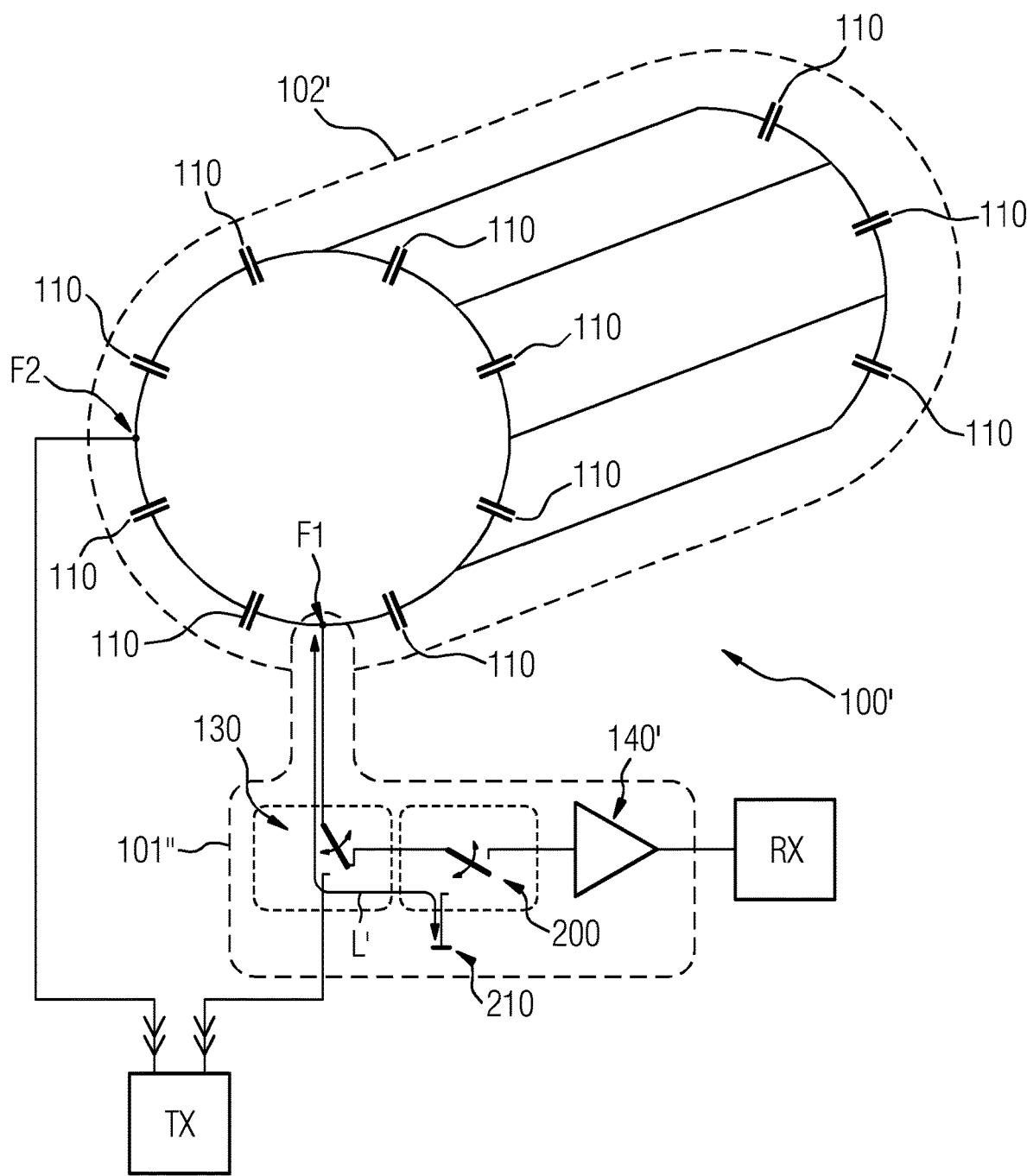
FIG. 6 depicts a schematic diagram of a further variant of the body coil.

FIG. 6 depicts a further variant of the body coil 100' that is particularly suitable if magnetic resonance signals are to be excited solely with the aid of body coil 100', for example, if it is not provided that excitation signals are transmitted by possible local coils 30.

The pre-amplification unit 101" includes a first switch 130 configured to switch the feed point of the antenna unit between a transmitting path (TX) and a receiving path (RX). This first switch 130 may be power-fixed since high powers may occur in the transmitting path.

Provided in the receiving path is a terminating impedance 210 and a second switch 200 that may switch between the pre-amplifier 140' and the terminating impedance 210. Since, conventionally, lower powers occur in the receiving path than in the transmitting path it may be sufficient if the second switch 200 has a lower power than the first switch 130.

The terminating impedance 210 does not necessarily have to be power-fixed. In particular, if possible local coils 30 are not provided for transmitting excitation signals, there is no need to fear coupling of power into the receiving path caused thereby, which may lead to damage to the terminating impedance 210.

If magnetic resonance signals are to be received by possible local coils 30, the second switch 200 may switch to the terminating impedance 210. The transformation in the feed point F1 may be configured such that a maximum detuning effect is attained for the body coil 100' and the local coils 30 may detect the magnetic resonance signals with an optimally high signal-to-noise ratio.

If the terminating impedance 210 is configured as a short circuit, (e.g., the terminating impedance has an input reflection factor of −1), a cable length L' between the short circuit 210 and the feed point F1 of an integral multiple of half the wavelength of the signals is recommended, with which the magnetic resonance signals are excited.

FIG. 5 depicts a method for operating a magnetic resonance device 10 having a body coil 100' and at least one local coil 30. Magnetic resonance signals are excited in act 501 and at least some of the magnetic resonance signals are received in act 502.

With excitation of the magnetic resonance signals by the at least one local coil 30 the antenna unit 102' of the body coil 100' may be connected in act 501 to the high-power impedance 160 to prevent damage to the pre-amplifier 140'.

In act 502, the signals may be received simultaneously by the at least one local coil 30 and the body coil 100' without significant coupling occurring between the coils.

Furthermore, it is conceivable for the magnetic resonance signals to be excited in act 501 solely by the body coil 100' and when the magnetic resonance signals are received by the local coil 30 in act 502 the feed point F1 of the antenna unit 102' is connected to the terminating impedance 210.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A body coil comprising:
   at least one antenna unit free from detune circuits; and
   at least one pre-amplification unit comprising a pre-amplifier and a cable or the pre-amplifier, the cable, and at least one transformation element,
   wherein the pre-amplification unit is arranged at a feed point of the antenna unit,
   wherein the pre-amplification unit is configured to amplify magnetic resonance signals received by the body coil, and
   wherein, at the feed point of the antenna unit, the pre-amplifier has an input reflection factor transformed by a length of the cable, the at least one transformation element, or a combination thereof such that the value of the input reflection factor is greater than 0.7 and is configured to provide a detuning effect.

2. The body coil of claim 1, wherein the body coil comprises a birdcage coil, a TEM-antenna, a saddle coil, or a combination thereof.

3. The body coil of claim 1, wherein the body coil comprises a birdcage coil having at least one end ring and at least one rod, and
   wherein the feed point is located at the at least one end ring, centrally on the at least one rod, or both at the at least one end ring and centrally on the at least one rod.

4. The body coil of claim 1 wherein the pre-amplification unit comprises a switch for connecting the pre-amplifier to the feed point of the antenna unit.

5. The body coil of claim 1, wherein the pre-amplification unit comprises high-power impedance.

6. The body coil of claim 5, wherein the high-power impedance has the input reflection factor whose value is greater than 0.7.

7. The body coil of claim 5, wherein the pre-amplification unit comprises a switch for connecting the high-power impedance to the feed point of the antenna unit.

8. The body coil of claim 1, wherein the input reflection factor of the pre-amplification unit has a phase in a range of 165° to 195° at the feed point of the antenna unit.

9. The body coil of claim 8, wherein the transformation element of the pre-amplification unit is configured to adjust the phase of the input reflection factor.

10. The body coil of claim 8, wherein the cable length of the pre-amplification unit is matched to the phase for adjusting the phase of the input reflection factor.

11. The body coil of claim 1, wherein the pre-amplification unit comprises a first switch configured to switch the feed point of the antenna unit between a transmitting path and a receiving path,
   wherein the pre-amplification unit in the receiving path comprises terminating impedance, the pre-amplifier, and a second switch,
   wherein the second switch is configured to switch between the terminating impedance and the pre-amplifier.

12. The body coil of claim 11, wherein the terminating impedance has an input reflection factor of −1.

13. The body coil of claim 11, wherein the body coil is configured to excite
   excitation signals of an excitation signal wavelength, and
   wherein the length of cable is between the feed point of the antenna unit and the terminating impedance, which is an integral multiple of half the wavelength of the excitation signal wavelength.

14. The body coil of claim 11, wherein the first switch has a higher power than the second switch.

15. The body coil of claim 1, wherein the at least one transformation element comprises a phase shifter.

16. A magnetic resonance device comprising:
   at least one local coil; and
   a body coil comprising:
     at least one antenna unit free from detune circuits; and
     at least one pre-amplification unit comprising a pre-amplifier and a cable or the pre-amplifier, the cable, and at least one transformation element,
     wherein the pre-amplification unit is arranged at a feed point of the antenna unit,
     wherein the pre-amplification unit is configured to amplify magnetic resonance signals received by the body coil, and
     wherein, at the feed point of the antenna unit, the pre-amplifier has an input reflection factor transformed by a length of the cable, the at least one transformation element, or a combination thereof such that the value of the input reflection factor is greater than 0.7 and is configured to provide a detuning effect.

17. A method for operating a magnetic resonance device having a body coil and at least one local coil, wherein the body coil comprises at least one antenna unit free from detune circuits and at least one pre-amplification unit having a pre-amplifier and a cable or the pre-amplifier, the cable, and at least one transformation element, wherein the pre-amplification unit is arranged at a feed point of the antenna unit, and wherein, at the feed point of the antenna unit, the pre-amplifier has an input reflection factor transformed by a length of the cable, the at least one transformation element, or a combination thereof such that the value of the input reflection factor is greater than 0.7, the method comprising:
- exciting magnetic resonance signals by the body coil or the at least one local coil;
- receiving at least some of the magnetic resonance signals by the body coil; and
- amplifying the at least some magnetic resonance signals by the pre-amplification unit with the input reflection factor to provide a detuning effect.

18. The method of claim 17, wherein the body coil further comprises a high-power impedance, and
- wherein, during excitation of the magnetic resonance signals by the at least one local coil, the antenna unit of the body coil is connected to the high-power impedance.

19. The method of claim 17, wherein signals are received simultaneously by the at least one local coil and the body coil.

20. The method of claim 17, wherein the body coil further comprises a terminating impedance,
- wherein the magnetic resonance signals are excited solely by the body coil,
- wherein the receiving of the magnetic resonance signals is by the at least one local coil and the antenna unit of the body coil is connected to the terminating impedance.

* * * * *